(12) United States Patent
Vujkovic et al.

(10) Patent No.: US 8,689,165 B2
(45) Date of Patent: Apr. 1, 2014

(54) OPTIMIZING DESIGNS OF INTEGRATED CIRCUITS

(75) Inventors: Jovanka Ciric Vujkovic, San Jose, CA (US); Kenneth S. McElvain, Menlo Park, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/007,579

(22) Filed: Jan. 14, 2011

(65) Prior Publication Data

US 2011/0113399 A1   May 12, 2011

Related U.S. Application Data

(62) Division of application No. 11/726,777, filed on Mar. 22, 2007, now Pat. No. 7,873,930.

(60) Provisional application No. 60/785,443, filed on Mar. 24, 2006.

(51) Int. Cl.
   *G06F 17/50* (2006.01)

(52) U.S. Cl.
   USPC .......................................... 716/126; 716/130

(58) Field of Classification Search
   USPC ................................. 716/118–126
   See application file for complete search history.

(56) References Cited

U.S. PATENT DOCUMENTS

| | | | |
|---|---|---|---|
| 6,438,735 B1 | 8/2002 | McElvain et al. | |
| 6,449,762 B1 | 9/2002 | McElvain | |
| 6,973,632 B1 | 12/2005 | Brahme et al. | |
| 7,131,096 B1 | 10/2006 | Balsdon et al. | |
| 7,149,997 B1 | 12/2006 | Young et al. | |
| 7,251,800 B2 * | 7/2007 | McElvain et al. | 716/112 |
| 7,519,927 B1 | 4/2009 | Hryckowian et al. | |
| 2001/0010090 A1 * | 7/2001 | Boyle et al. | 716/2 |
| 2002/0083407 A1 | 6/2002 | Suzuki et al. | |
| 2004/0243964 A1 * | 12/2004 | McElvain et al. | 716/12 |
| 2007/0240091 A1 * | 10/2007 | Vujkovic et al. | 716/13 |

FOREIGN PATENT DOCUMENTS

JP      2004-252762      9/2004

OTHER PUBLICATIONS

M. Hrkic, J. Lillis, G. Beraudo, "An Approach to Placement-Coupled Logic Replication", Proceedings of the 41st Annual Conference on Design Automation, Jun. 7-11, 2004, pp. 711-716.

(Continued)

*Primary Examiner* — Binh Tat
(74) *Attorney, Agent, or Firm* — Blakely, Sokoloff, Taylor & Zafman LLP; Judith A. Szepesi

(57) ABSTRACT

Methods and systems for optimizing and/or designing integrated circuits. One exemplary method includes routing, as part of a process of designing an integrated circuit (IC), connections on a representation of the IC using a first set of wiring resources and marking wiring resources as used once the wiring resources within the first set have been used for routing and routing, using a second set of wiring resources in the representation, connections on the IC without checking whether wiring resources within the second set have been previously used to route connections, wherein wiring resources in the second set differ, on average, in physical size, from wiring resources in the first set. Other methods and systems for optimizing and/or designing ICs are also described, and machine-readable media containing executable program instructions which cause systems to perform one or more of these methods are also described.

23 Claims, 17 Drawing Sheets

(56) References Cited

OTHER PUBLICATIONS

Murooka T et al., "An architecture-oriented routing method for FPGAs having rich hierarchical routing resources", Design Automation Conference 1998. Proceedings of the ASP-DAC '98. Asia and South Pacific Yokohama, Japan Feb. 10-13, 1998, New York, NY, USA IEEE, US, Feb. 10, 1998, pp. 527-533.

PCT Notification Concerning Transmittal of International Preliminary Report on Patentability (Chapter of the Patent Cooperation Treaty);and Written Opinion for PCT/US2007/007311, International filing date Mar. 23, 2007, mailed Oct. 9, 2008, 7 pages.

PCT/US2007/007311, PCT Invitation to Pay Additional Fees, mailed Sep. 14, 2007, 11 pages.

PCT/US2007/007311, PCT Written Opinion of the International Searching Authority, dated Sep. 24, 2008, 11 pages.

PCT/US2007/007311, PCT International Search Report, mailed Jan. 10, 2008, 7 pages.

Rautela D et al., "Design and Implementation of FPGA Router for Efficient Utilization of Heterogeneous Routing Resources", VLSI, 2005, Proceedings. IEEE Computer Society Annual Symposium on Tampa, FL, USA May 11-12, 2005, Piscataway, NJ, USA, IEEE, May 11, 2005. pp. 232-237.

Zhibin Dai et al., "Routability Prediction for field programmable gate arrays with a routing hierarchy", VLSI Design, 2003. Proceedings. 16th International Conference on Jan. 4-8, 2003, Piscataway, NJ, USA, IEEE, Jan. 4, 2003, pp. 85-90.

* cited by examiner

OPTIMIZING DESIGNS OF INTEGRATED CIRCUITS

This application is a divisional of U.S. application Ser. No. 11/726,777, filed on Mar. 22, 2007, which is now U.S. Pat. No. 7,873,930, to issue on Jan. 18, 2011. This application is also related to and claims the benefit of the filing date of U.S. Provisional Patent Application No. 60/785,443, filed on Mar. 24, 2006, which provisional application is hereby incorporated herein by reference.

FIELD OF THE INVENTION

The present invention relates generally to the field of circuit design, and more particularly to automated circuit design synthesis through a hardware description language.

BACKGROUND

For the design of circuits on integrated circuits (ICs), designers often employ computer aided design techniques. Standard languages known as Hardware Description Languages (HDLs) have been developed to describe circuits to aid in the design and simulation of complex circuits. Several HDLs, such as VHDL and Verilog, have evolved as industry standards. VHDL and Verilog are general purpose hardware description languages that allow definition of a hardware model at the gate level, the register transfer level (RTL), or the behavioral level using abstract data types.

In designing circuits using HDL compilers, designers first describe circuit elements in HDL source code and then compile the source code to produce synthesized RTL netlists. The RTL netlists correspond to schematic representations of circuit elements. The circuits containing the synthesized circuit elements are often optimized to improve timing relationships and eliminate unnecessary or redundant logic elements. Such optimization typically involves substituting different gate types or combining and eliminating gates in the circuit. FIG. 1 shows a representative flow for designing certain types of ICs, such as Field Programmable Gate Arrays (FPGAs) which have a predetermined architecture, referred to as a target architecture. Operation 101 involves receiving a description (e.g. a description written in HDL) of an IC by a compiler which, in operation 103, performs a synthesis from the HDL description to an RTL description. In operation 105, the RTL description is mapped to a target architecture, such as the architecture of a Xilinx FPGA, and optimization within the target architecture is performed. After optimization is completed, a netlist for the target architecture is generated. Various methods and systems for computer aided design of ICs are described in U.S. Pat. Nos. 6,438,735; 6,449,762; and 6,973,632, all of which are incorporated herein by reference.

FIG. 2 shows further details regarding a method, in the prior art, for optimizing a design of an IC. In operation 151, the loads which are driven by a particular component are determined, and in operation 153, a most critical load, of those loads, is determined. Then the particular critical component is replicated (operation 155) and the most critical load is connected (operation 157) to the replicated critical component. This will tend to reduce fanout at the source of the wiring net from the original critical component. The load is considered critical if it adversely affects timing constraints or requirements for the IC (or if it has negative slack), and the component is considered critical because it is driving the critical load. The slack of the IC is then recomputed in operation 159 and it is determined whether slack has improved (operation 161). If the slack has not improved, then the replication is discarded (operation 163) and processing returns to operation 151. If the slack has improved, then processing returns from operation 161 to operation 151 as shown in FIG. 2 to optimize other paths having other critical components. FIGS. 3A, 3B, and 3C show an example of the optimization method of FIG. 2.

FIG. 3A shows a representation of at least a portion of an integrated circuit which may be designed according to the method of FIG. 1, with an optimization performed according to the method of FIG. 2. The design at this stage shown in FIG. 3A includes 9 switch matrices (SM) on the representation 201 of the integrated circuit. Switch matrices are common interconnection devices used on certain types of field programmable gate arrays, such as gate arrays from Xilinx. The switch matrices 202-210 allow for the interconnection of various components, such as driver components which output signals to loads which receive those signals. The design shown in FIG. 3A includes one driver 215 and 7 loads, L1-L7. In particular, driver 215 drives loads 216-222 through the routing net shown in FIG. 3A which includes wires W1, W2, and W3. The routing net includes those three wires which are existing wire resources on the IC. The switches on the switch matrix 209 through which the wires are connected are labeled SW1, SW2, and SW3, and the switch at the driver is labeled SWD. The critical loads in the design are L1, L2, L3 and L4 in the order of criticality, most critical being first. The delay of the net on each load depends on the wire delay, the switch delay and the fanout at each switch. The fanout at switch SWD is equal to 3 because there are 3 wires going to switches SW1, SW2, and SW3, which contribute with their capacitances to the wire delay. The total fanout of the net from driver D215 is equal to 7, but the root fanout at the switch SWD is only 3. Further details showing the root fanout at switch SWD is shown in FIG. 3B which shows the driver component 215 providing an input to the switch matrix 209 which is received by a driver 230 which in turn drives 3 pass gates (225, 226 and 227) in the switch SWD as shown in FIG. 3B. Each pass gate has a parasitic capacitance, an example of which is shown as parasitic capacitance 231 on the pass gate 225. These parasitic capacitances add to the delay at the root fanout. It will be appreciated that the driver component 215 may be one of a variety of different logic components, such as a flip-flop, a lookup table or other types of logic, including digital logic circuits.

Previous methods for replication were concentrating at reducing the fanout, particularly the fanout at the root of the net, without paying attention at how the net is wired using existing wiring resources. For example, if we want to reduce the fanout by isolating the critical loads L1 and L2, the driver D can be replicated and the copied driver 215A can drive the rest of the loads. The total fanout of the net driven from the driver 215 will be 2 (down from 7) and the total fanout of the net driven from driver 215A will be 5. This is depicted in FIG. 3C. However, in terms of delay, little will be changed for critical loads L3 and L4 because the root delay of the net driven from driver 215A is still 3 as before replication, and the delay of the switch 254 and the wire W1A which is connecting loads L3 and L4 will be bigger if the faster wire W1 was taken to connect to L1 and L2.

It is desirable to provide improved automated circuit design techniques, including techniques which include improved routing and optimization techniques which are described herein.

SUMMARY OF THE DESCRIPTION

The present inventions relate to various methods and apparatuses for designing an integrated circuit, and particularly to automated design using a data processing system to design one or more integrated circuits. According to one aspect of the present inventions, an exemplary method for designing an integrated circuit includes routing, at a first routing level as part of the process of designing the IC, connections on a representation of the IC using a first set of wiring resources and marking wiring resources as used once the wiring resources within the first set have been used for routing and routing, at a second routing level using a second set of wiring resources in the representation of the IC, connections on the IC without checking whether wiring resources within the second set have been previously used to route connections, wherein wiring resources in the second set differ, on average, in physical size from wiring resources in the first set. Typically, the wiring resources in the second set are, on average, longer than wiring resources within the first set and the routing, which uses the second set, is performed without marking wiring resources within the second set as reserved once those wiring resources have been used as part of a routing operation.

According to another aspect of the present inventions, an exemplary method includes determining a fanout of a driving component in a representation of the IC being designed, determining for the driving component the loads in the representation of the IC, driven by the driving component, determining the use of existing wire resources used to connect the loads to the driving component, and optimizing, based on the use of existing wiring resources and the fanout of the driving component and the loads being driven by the driving component, a design of the IC. Typically, the optimizing includes determining whether to reduce fanout at the driving component by replicating the driving component, and the replicating is performed automatically by a data processing system which is configured with a machine-readable medium to perform the replicating.

According to another aspect of the present inventions, an exemplary method includes determining, as part of a process of designing an integrated circuit, a routing net from a load to a driving component and determining available places for a replicated version of the driving component, and creating, in the representation of the integrated circuit, the replicated version of the driving component based on the routing net and the available places and creating connections, in the representation, between the replicated version and the load. This method may be used to perform load-based replication in which the replication is performed by backtracking from a critical load through the available wires and by examining available places for the replicated driver. Further, other critical loads in the area which may be driven by the same replicated driver may also be connected through a progressive routing method described below.

According to another aspect of the inventions described herein, an exemplary method includes replicating, as part of a process of designing an integrated circuit, a component in a representation of the IC and labeling the component as a replicated component having an output which is equivalent to an output of the component, and routing, in the representation, connections between the replicated component and the loads of the replicated component, and determining whether to use the replicated component as a source to drive at least one existing load of the component. At least certain embodiments of this aspect allow routing, in order to drive loads, from equivalent sources rather than the original source. By placing a tag on the replicated instances throughout the synthesis process, it is possible to identify equivalent sources which have been previously replicated so that routing operations may use those sources rather than an original source.

According to another aspect of the present inventions described herein, an exemplary method includes determining whether a value for a wiring delay should be adjusted based upon a geometry of a wiring net in a representation of an integrated circuit being designed, and adjusting the value if the geometry is of a first type, and determining routing decisions, in the process for designing the integrated circuit, based on the value after the adjusting. This exemplary embodiment may be used to adjust for characterized wiring delays, which may be either measured or estimated, based upon whether a particular long distance wiring net is primarily a straight line through groups of switching matrices or a staircased path through another group of switching matrices.

The present inventions provide computer systems which are capable of performing various methods of the inventions, and the inventions also provide computer readable media, such as machine-readable media, which contain executable program instructions which when executed by a data processing system, such as a computer system, cause the data processing system to perform one or more of the methods described herein. Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION

Methods and systems and machine-readable media for designing, through an automated design process, an integrated circuit are described.

The subject invention will be described with reference to numerous details set forth below, and the accompanying drawings will illustrate the invention. The following description and drawings are illustrative of the invention and are not to be construed as limiting the invention. Numerous specific details are described to provide a thorough understanding of the present invention. However, in certain instances, well known or conventional details are not described in order to not unnecessarily obscure the present invention in detail.

Lead Fanout Reduction by Replication Based Upon Existing Wiring Resources

Figure 3A:
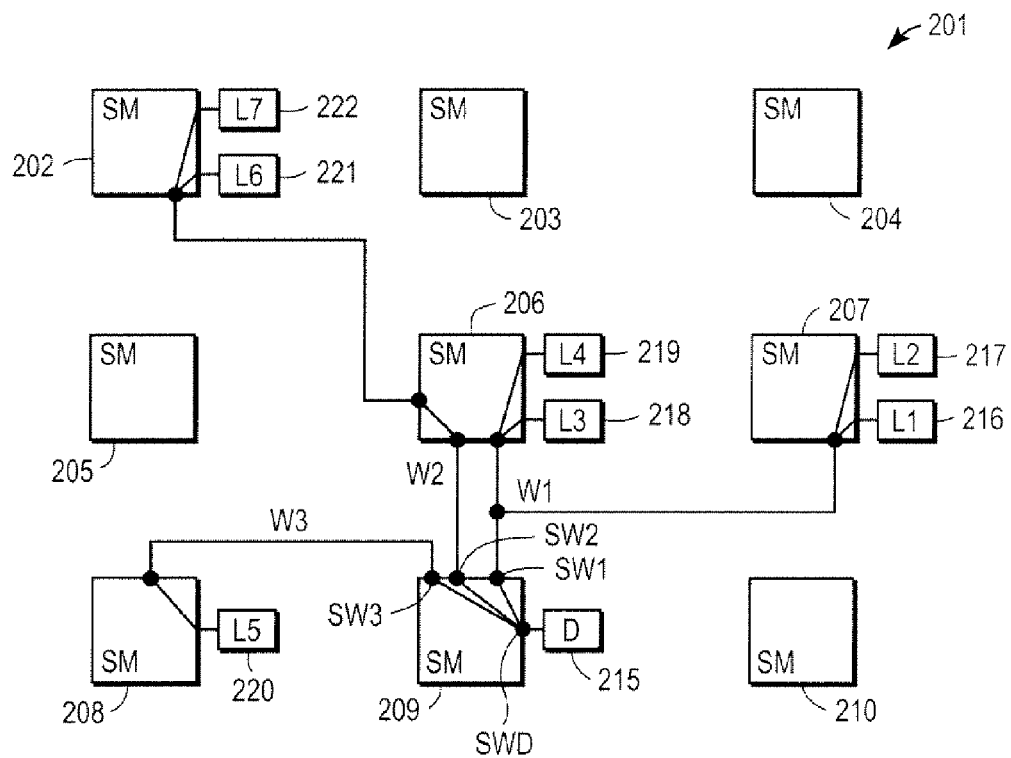
FIG. 3A shows a representation of an integrated circuit during an automated design process.
Figure 3B:
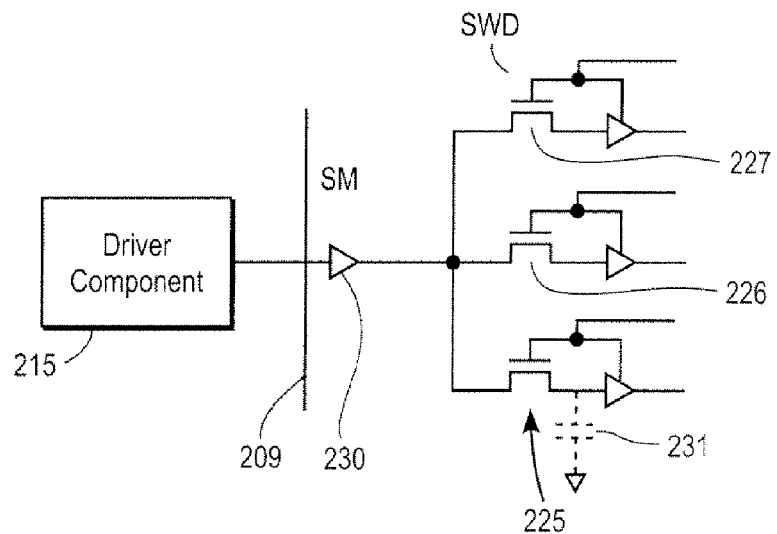
FIG. 3B shows further detail within the switching matrix of the design shown in FIG. 3A.
Figure 3C:
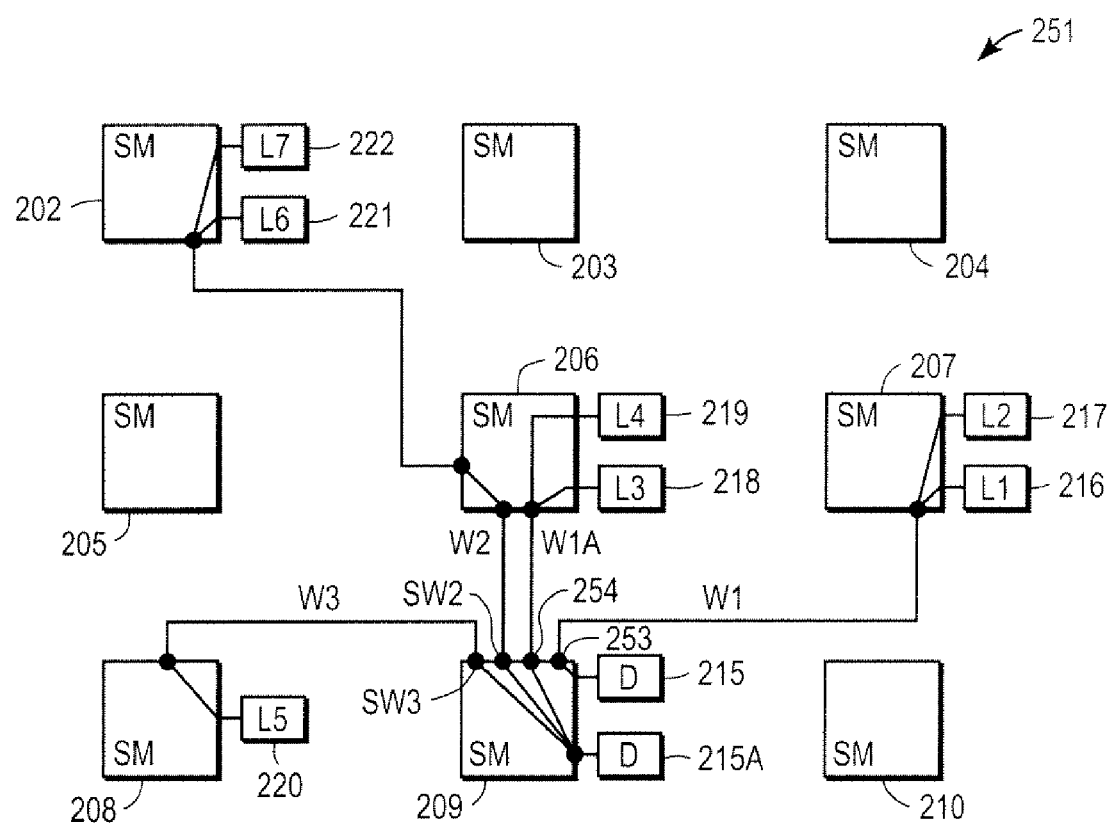
FIG. 3C shows the result of an optimization in the prior art performed according to the method shown in FIG. 2.
Figure 5:
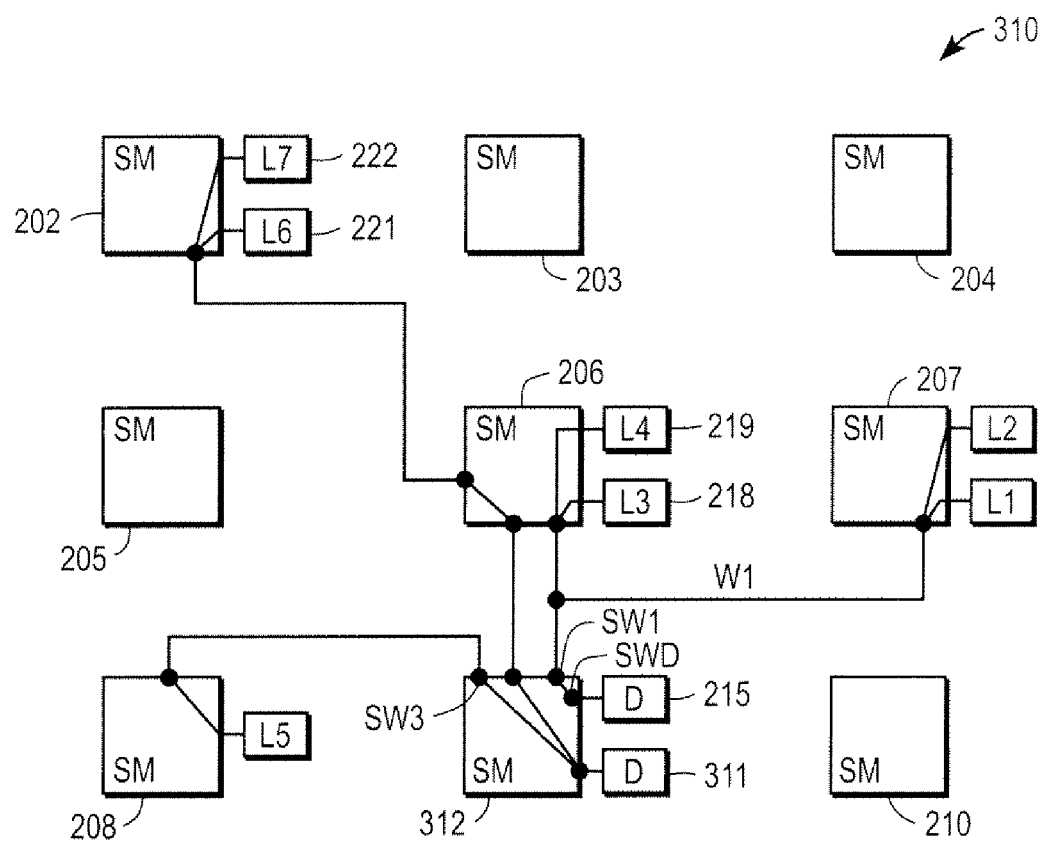
FIG. 5 shows a representation of an optimization resulting from one embodiment of the method shown in FIG. 4.

By utilizing information about the existing wiring sources when replication is performed to reduce fanout, such as fanout at the root of a routing net, improved routing decisions and improved results may be achieved as shown in FIG. 5 relative to FIG. 3C. In particular, by taking into account the existing wiring resources before replicating the driver 215, it may be decided that critical loads L1, L2, L3 and L4 should be connected with wire W1 from the driver D (driver 215) and that the rest of the loads are driven from the replicated copy of driver D, which is shown as driver 311 in FIG. 5. The root fanout at the switch SWD is still 1, because the loads L1-L4 are driven with the same wire W1. The root fanout at the replicated copy of the driver 311 is reduced by 1, so other loads driven by the driver 311 will have a better net delay due to the reduction of root fanout at the replicated driver. The critical loads L1-L4 will have improvement in net delay from the original netlist shown in FIG. 3A, resulting in improvement in 4 different paths compared to only improvement in only 2 critical paths as shown in FIG. 3C.

Figure 4:
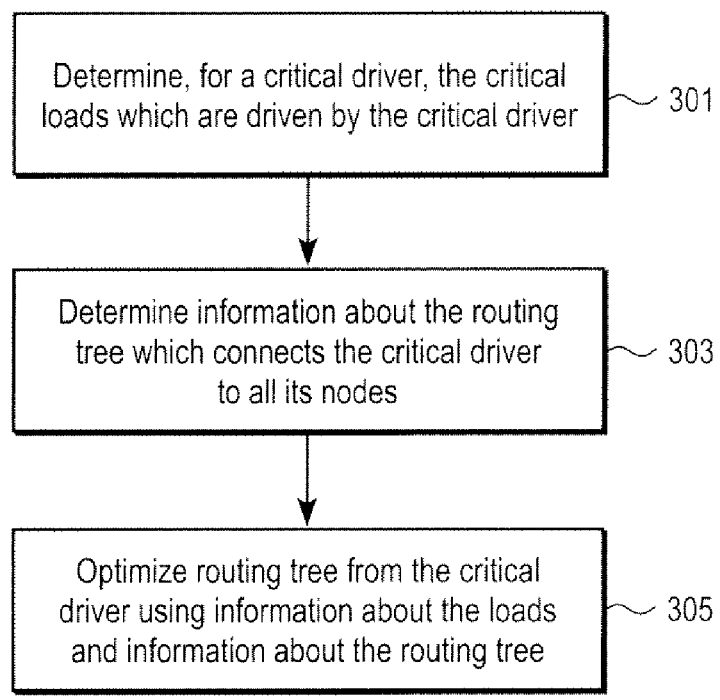
FIG. 4 is a flowchart which illustrates one exemplary embodiment of the inventions for performing an optimization of an integrated circuit design.

FIG. 4 shows a general method for performing routing operations using information about the routing tree when replicating drivers either at a root fanout location or at an intermediate fanout location throughout a routing net. Operation 301 includes determining, for a critical driver, such as the driver 215, the critical loads which are driven by the critical driver. This typically involves determining whether certain loads are critical loads and then determining the drivers which drive those critical loads. Those drivers are critical drivers because they drive the critical loads. The loads are critical because, for example, they affect timing constraints or requirements. For example, a load may be critical if a slack measurement at a particular load output is negative or not positive enough. In the case of the design shown in FIG. 5, the loads L1-L4 are critical loads which are driven by the critical driver 215. Operation 301 of course performs this determination based on the original design before this optimization, and thus the integrated circuit shown in FIG. 3A is used in operation 301 to determine, for the critical driver 215, which loads are critical. Then, using the same unoptimized design, operation 303 determines information about the routing tree which connects the critical driver to all of its loads. Thus, in the case of the design shown in FIG. 3A, operation 303 determines information about the routing tree which connects the critical driver 215 to all 7 of the loads L1-L7. Then in operation 305, the routing tree is optimized from the critical driver using the information about the loads and using the information about the routing tree. Hence, the optimization process considers the actual existing wiring resources which are used to couple the critical driver 215 to its various loads when determining how to replicate the driver and how to route the replicated driver and the original driver relative to the original loads. Thus the optimization process in operation 305 changes the design shown in FIG. 3A to create the design shown in FIG. 5 in which the replicated driver 311 has a reduced fanout and drives all loads except the critical loads, while the original driver 215 continues to use the same routing net shown in FIG. 3A and has a reduced root fanout. As noted previously, this method may be performed to reduce root fanout for all critical drivers in a design and may optionally be used to perform a reduction of fanout at intermediate drivers throughout a routing tree. This method may be performed by using techniques known in the field of operations research to achieve optimal or near optimal routing using information about the loads, the driver(s) and also the actual existing wiring resources which couple the loads to the driver and which can be used to couple to new drivers created through replication. The parameter which is optimized by the operation research techniques may be timing.

Figure 6:
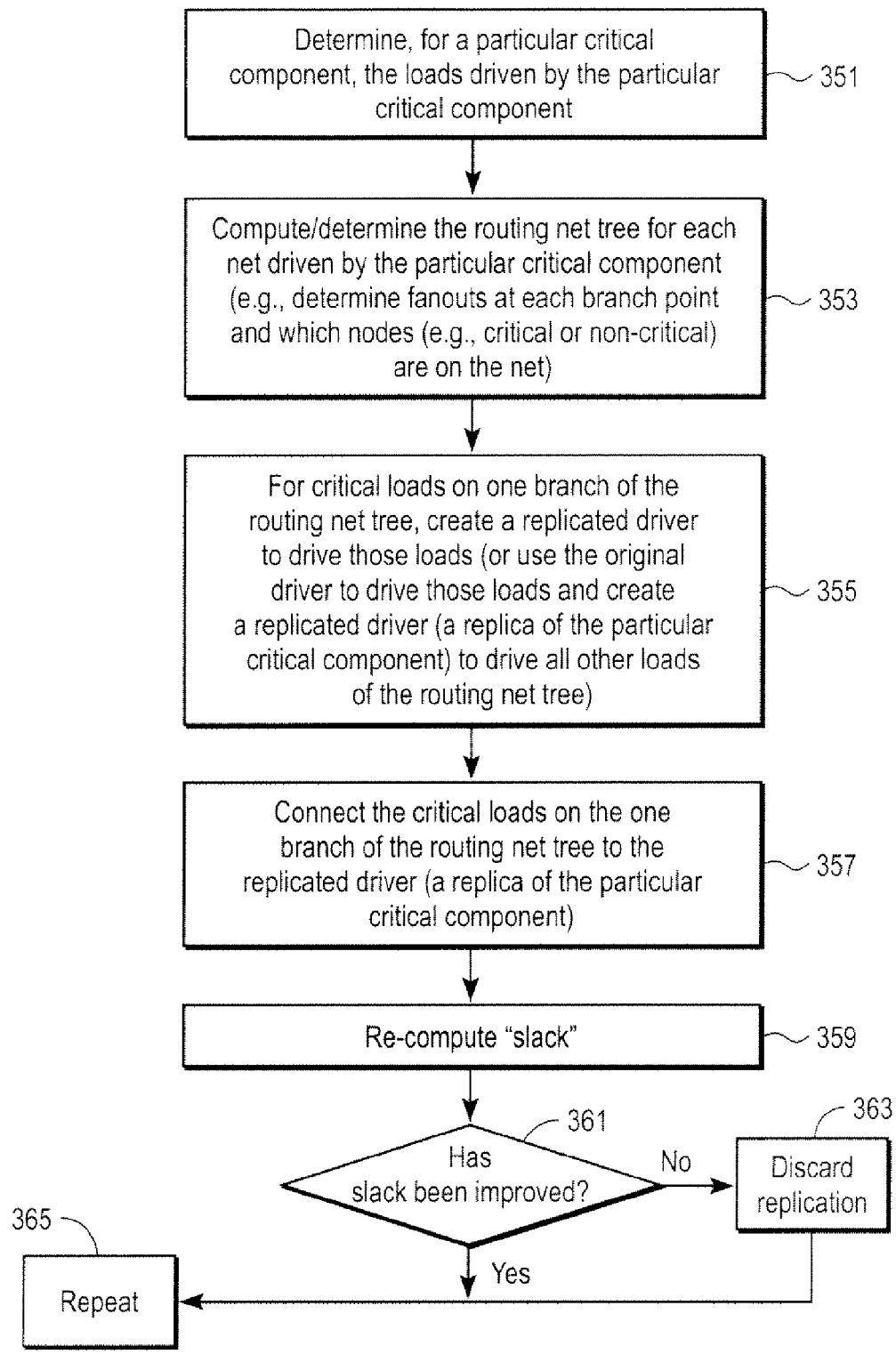
FIG. 6 is a flowchart which illustrates a particular embodiment for optimizing an integrated circuit design in which root fanout is reduced based at least in part upon knowledge about the existing wiring net which is coupled to the root.

FIG. 6 is a flowchart which illustrates one particular example in which the method of FIG. 4 may be performed to optimize a design of an integrated circuit by reducing root fanout from a driver, which in the case of FIG. 6 is assumed to be a critical driver or component. It will be appreciated that "driver" or "component" refers to logic elements, such as flip-flops or lookup tables or other digital logic components which generate signals which in turn are outputted to other components which receive those signals as inputs to the other components. The method of FIG. 6 begins in operation 351 in which it is determined, for a particular critical component, which loads are driven by that particular critical component. In operation 353, the routing net tree is computed or determined for each net driven by the particular critical component. For example, the fanouts at each branch point in that routing tree are determined, and it is determined which nodes are critical or non-critical on the net. Then in operation 355, after gathering information about the actual routing tree, a replicated driver, which is a replicated version of the particular critical component, is created for all critical loads on one branch of the routing net tree, and this replicated driver is used to drive those loads. Alternatively, the original driver may be used to drive those loads on the one branch of the routing net tree and a replicated driver, which is a replica of the particular critical component, is used to drive all other loads of the routing net tree. This alternative is what was performed to create the design of FIG. 5 in which the original driver 215 was kept in its place to drive the 4 critical loads while a replicated driver 311 was used to drive, through a modified routing net tree, the remaining loads. In operation 357, the critical loads are connected to the replicated driver and then in operation 359, slack is recomputed. If slack is determined, in operation 361, to have improved, then the method returns, through operation 365, to attempt to optimize other routing nets by repeating the operations shown in FIG. 6, beginning again from operation 351. If slack has not been improved as determined in operation 361, then the replication is discarded in operation 363 and processing returns to operation 351 to attempt to optimize the design in other ways.

Load-Based Replication

Figure 1:
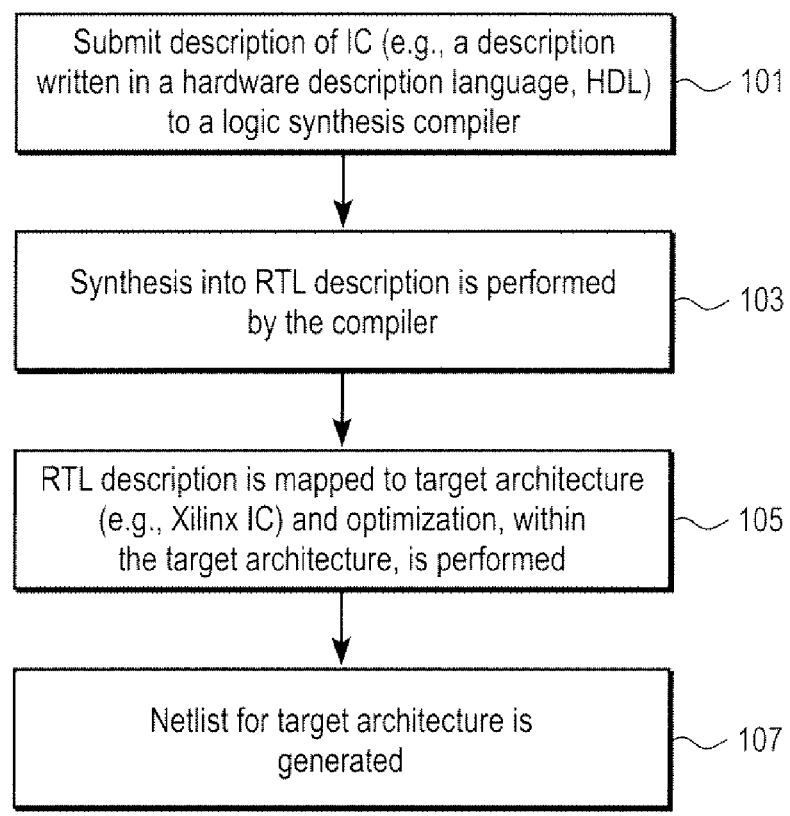
FIG. 1 is a flowchart which illustrates a process of HDL synthesis which may be used in at least certain embodiments of the present inventions.
Figure 2:
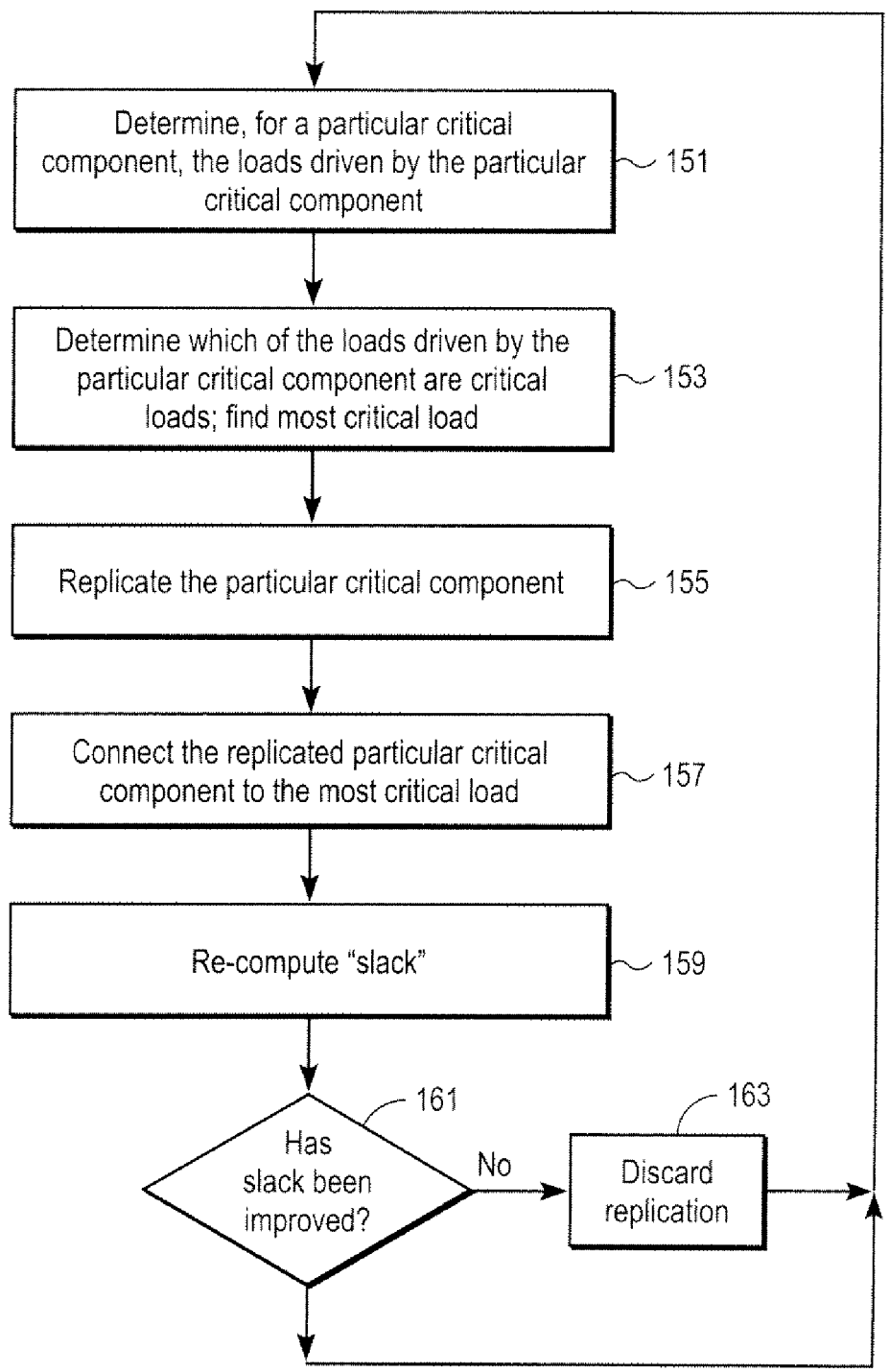
FIG. 2 is a flowchart which shows a prior art method for optimizing a design of an integrated circuit in an automated computer-aided design system.
Figure 7:
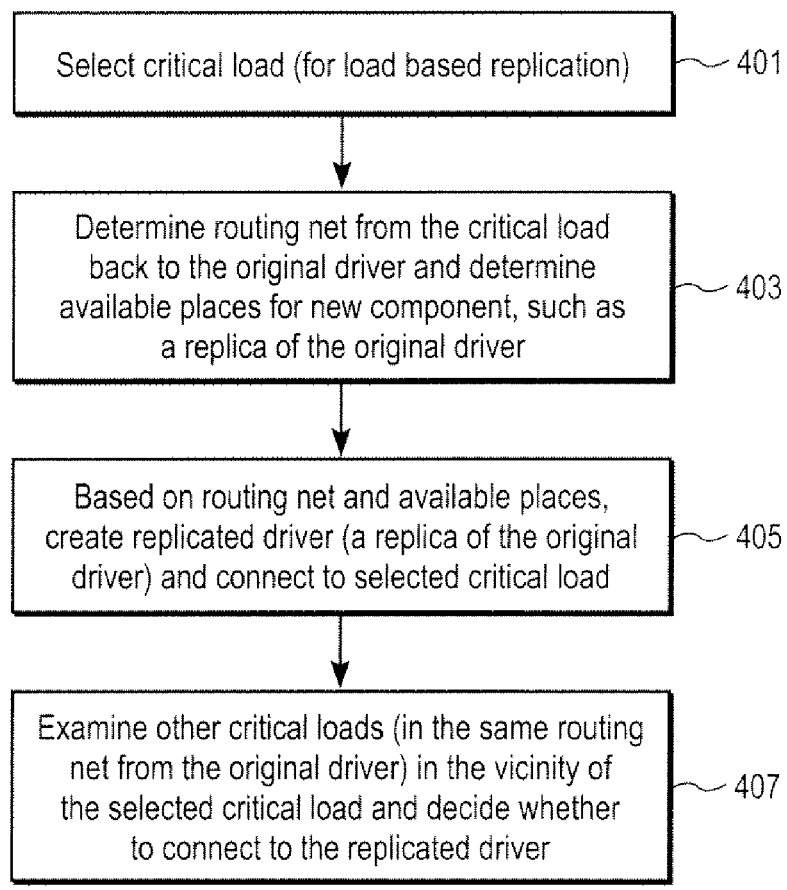
FIG. 7 is a flowchart which illustrates an exemplary embodiment of another aspect of the present inventions described herein.

Load-based replication is performed when there is a small number of critical loads on a net. A dedicated copy for each load is created. In an example shown in FIG. 3A, if loads L3 and L4 were not critical, then creating a copy of a driver for only L1 and L2 is a good solution. In the case of a flip-flop as a driver, the driver can be placed in close proximity to the loads and the loads are connected to the fastest possible wire. In performing load-based replication, the process begins from the load side and examines the routing net by backtracking from the load through the available existing wires to the driver. This process can also take into account available locations for placement of the replicated driver in the process of backtracking through the existing wiring net. Further, the process may evaluate whether other critical loads driven by the same driver are also present in the same area and use the progressive routing techniques described below to connect the other critical loads also to the replicated driver. This is unlike prior solutions which would just replicate the driver for a particular critical load and then connect that replicated driver to the critical load. A version of this load-based replication process is shown in FIG. 7. It will be appreciated that the method shown in FIG. 7 is part of an optimization process, such as the optimization process shown in operation 105 of FIG. 1. The method of FIG. 7 may begin in operation 401 in which a critical load is selected for possible load-based replication. In operation 403, the routing net from that critical load is determined back to the original driver and it is also determined what places are available for a new copy of that original driver. Then in operation 405, based upon the routing net and the available places for the replicated copy, the method creates a replicated driver and connects it to the selected critical load. The method may then continue in operation 407 by examining other critical loads in the same routing net from the original driver in the vicinity of the selected critical load and decide whether or not to connect those other critical loads to the replicated driver.

Progressive Routing

Figure 8:
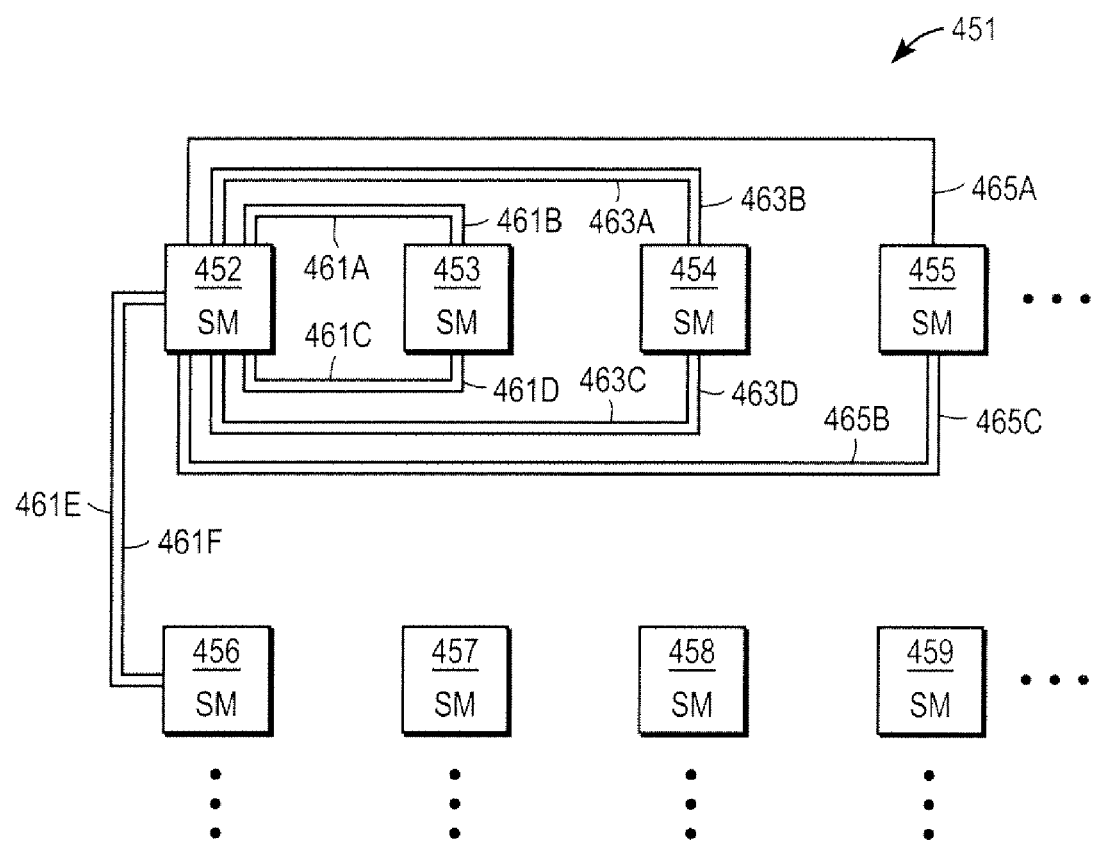
FIG. 8 shows the layout of interconnections in at least certain types of ICs.
Figure 9:
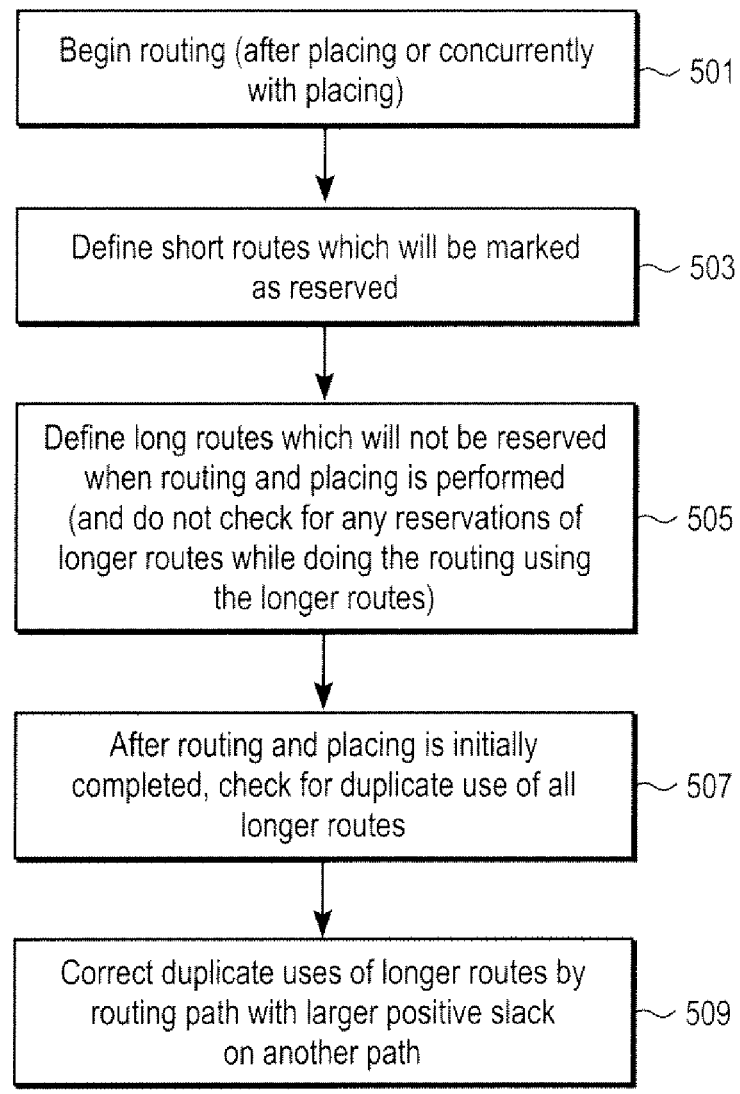
FIG. 9 is a flowchart which illustrates an exemplary method of a routing process according to certain embodiments of the present invention.
Figure 10:
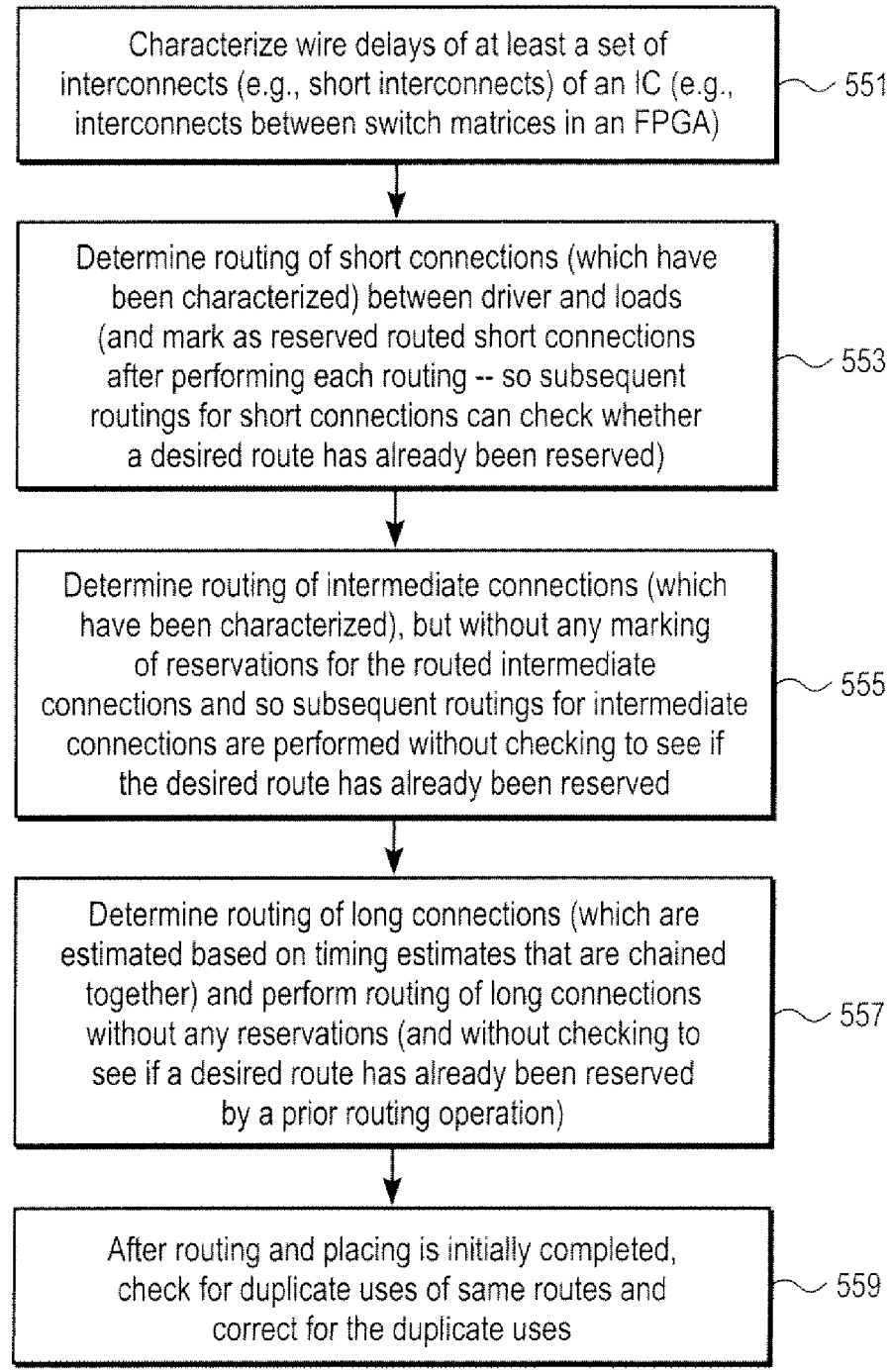
FIG. 10 is another flowchart showing a particular example of a routing process which is similar to the method shown in FIG. 9 and which may use the architecture of an integrated circuit such as that shown in FIG. 8.

FIGS. 8, 9, and 10 relate to a method for performing routing operations which may be performed after placement operations or concurrently with placement operations. This routing technique will often produce acceptable IC designs faster than prior art techniques because the runtime of the compiler used to synthesize and optimize a design is often improved by using the progressive routing technique described herein. This technique may utilize characterized wiring delays in a particular IC architecture, and these characterized wiring delays may be actually measured wiring delays or predicted or estimated wiring delays based on knowledge with respect to a particular chip architecture. The particular chip architecture is also referred to sometimes as a target architecture, which is typically determined by a supplier of the programmable integrated circuits. An example of a target architecture is the programmed lookup tables and associated logic of certain integrated circuits available from Xilinx, Inc. of San Jose, Calif. Other examples of target architectures include those well-known architectures in field programmable gate arrays and complex programmable logic devices from vendors such as Altera, and others. FIG. 8 shows an example of a particular IC architecture which utilizes an array of switching matrices, which are similar to the switching matrices shown in FIGS. 3A and 3B. These switching matrices are connected by existing wiring resources which are available to be used between the different switch matrices. The switches within the switch matrices may or may not connect, after the design is completed, to these various existing wiring resources. The architecture of the integrated circuit 451 shown in FIG. 8 includes switch matrices 452-459 which are coupled by what may be characterized as 3 different sets of wiring resources based upon a physical size, on average, of a wiring resource within one set of wiring resources. In particular, wires 461A, 461B, 461C, and 461D may be considered part of a first set of wiring resources because the length, on average, of those wiring resources is smaller than the length of other wiring resources shown in FIG. 8. Further, the wiring resources 461E and 461F may also be considered part of the first set of wiring resources given their short length. A longer set of wiring resources, and hence a second set of wiring resources, may include wiring resources 463A, 463B, 463C, and 463D. These wiring resources may be considered an intermediate wiring resource or set of wiring resources because their length is less than longer wiring resources but more than shorter wiring resources in the first set of wiring resources. The third set of wiring resources, which is the longest set of wiring resources shown in FIG. 8, includes wiring resources 465A, 465B, and 465C. These wiring resources are longer than any other wiring resource shown in FIG. 8. It will be appreciated that the integrated circuit represented by FIG. 8 may be larger and that there are further switch matrices not shown, and it will also be appreciated that additional wiring resources, which are not shown, are used to interconnect the switch matrices which are shown. These additional wiring resources have not been shown in order to simplify FIG. 8. The three sets of wiring resources may each be used to define how routing is performed and how delay through the routing net is estimated. In the case of FIG. 8, each set is defined based on the distance the net has to be routed across. The first set is for nets spanning the shortest distance, and in the process of routing those nets, wiring resources are tracked as they are used. There is a finite, small number of wires that connect from end to end of a short run. When such a net is routed, the wires used by a route which has been completed are marked as reserved, and before subsequent routes are completed, the method checks to determine whether a wiring resource is available (which can be determined by seeing whether a wiring resource has been marked as reserved or is no longer listed on an available list of wiring resources). The shorter wiring distance typically means that the delay through the wiring net is more accurate and may be obtained from actually measuring the wire or predicting the wiring delay based upon the physical structure of the wires on a particular integrated circuit. In the Xilinx FPGA Virtex family of integrated circuits, the first set of wiring resources is defined on a 5×5 CLB box, because these are the shortest, fastest wires that connect pins on that distance. The second set of wiring resources is defined for a distance which is bigger than the, on average, shorter distance of the first wiring resources. For example, the second set of wiring resources may be for a net which can be routed with 2 or more short wires. While this particular example is not shown in FIG. 8, certain IC architectures allow for a switch matrix to interconnect two short wires to create a longer wire. In this second set of wiring resources, the delay of the net is estimated but, as described below, the wire resources are not reserved as they are used in the routing process. This is an acceptable practice because there are more choices of wires to use in the routing process over longer distances. The delay prediction is still accurate because several wire choices lead to similar net delays, and the relative error in delay prediction is small. In the Xilinx FPGA Virtex family, this set of wiring resources is defined on a 13×13 box. The predicted delay may be obtained from point-to-point delays within this box, and the values for the delay may be stored in a lookup table. The third set of wiring resources may be for distances which are bigger than the second set and which can span the whole chip. For this set of wiring resources, an estimator with statistical detour analysis may be used to estimate the wiring delays.

FIG. 9 shows a general example of a method of routing which distinguishes between groups or sets of wiring resources based upon a difference, on average, in physical size between the wiring resources in each set. The method of FIG. 9 may be performed after placement of components in a representation of an integrated circuit during an automated design process or concurrently with placement as shown in operation 501. In operation 503, short routes, which will be marked as reserved, are defined in operation 503. In the example of FIG. 8, the wiring resources 461A-461F are defined as short routes which will be marked as reserved after performing a routing operation which uses one or more of those wiring resources. In operation 505, long routes are defined which will not be reserved when routing and placing is performed and hence the routing process does not check for any reservations of longer routes while doing the routing using the longer routes. This, of course, raises the possibility that some routes are used two or more times because no effort was made to check whether a particular long route had previously been used to route a connection through. In the example of FIG. 8, the wiring resources 463A-463D are an example of a set of long routes which are defined by operation 505. After routing and placing is initially completed, then an examination, in operation 507, is performed to determine whether there is any duplicate use of the longer routes which were not marked as reserved when performing the routing operations. It is anticipated that the software operations which are necessary to perform operation 507 will consume less time than the software operations which are required to mark used routes as reserved and then to check, when doing subsequent routing, whether a wiring resource has previously been used. In other words, it is anticipated that routing operations will be faster by ignoring whether prior routing operations for longer routes have used certain routes than in actually checking, when doing longer routes, whether prior routing operations have used any of the longer routes. If there are duplicate uses of longer routes, then in operation 509, the method corrects those duplicate uses by routing each of the duplicated uses through another path; preferably signals having the largest positive slack are selected for rerouting to avoid duplicate uses.

FIG. 10 shows a more detailed example of a method of progressive routing, which is similar to the method shown in FIG. 9 and may be employed in an architecture such as that shown in FIG. 8. The method of FIG. 10 begins in operation 551 in which the wire delays are characterized for at least a set of interconnects, such as the short interconnects of an integrated circuit. In the example of FIG. 8, the interconnects between switch matrices and a field programmable gate array are characterized by either actually measuring those delays or by estimating or predicting those delays. In operation 553, routing of the short connections, which have been characterized, is performed by determining routing between a driver and the loads for that driver. In each case, as a route is performed, it is marked as reserved so that subsequent routings for short connections can check whether or not a desired route, before it is used, has been previously used. The previous use is shown by whether or not it has been reserved. It will be appreciated that in alternative embodiments, a list of available routing resources may be maintained and once a routing resource is used, it is removed from the list so that subsequent routing operations, before finishing a routing operation, can check that list to determine whether or not the wiring resource is available depending on whether or not it is on the list. This may be considered to be another way of reserving or showing that a wiring resource has been used in a routing operation. In operation 555, the intermediate connections, which may be characterized, are routed, but these routing operations are performed without any marking of reservations for the routed intermediate connections, and so subsequent routings for intermediate connections are performed without checking to see if the desired route has been previously reserved because it has been used in a prior routing operation. In operation 557, routing of long connections is then performed by determining the routing of those long connections and doing so without any reservations and without checking to see if a desired route has already been used, as shown by a marked reservation by a prior routing operation. Finally, in operation 559, after routing and placing is initially completed, a check is performed for duplicate uses of the same routes and those duplicate uses are corrected as described above.

Routing from Equivalent Resources

Figure 11A:
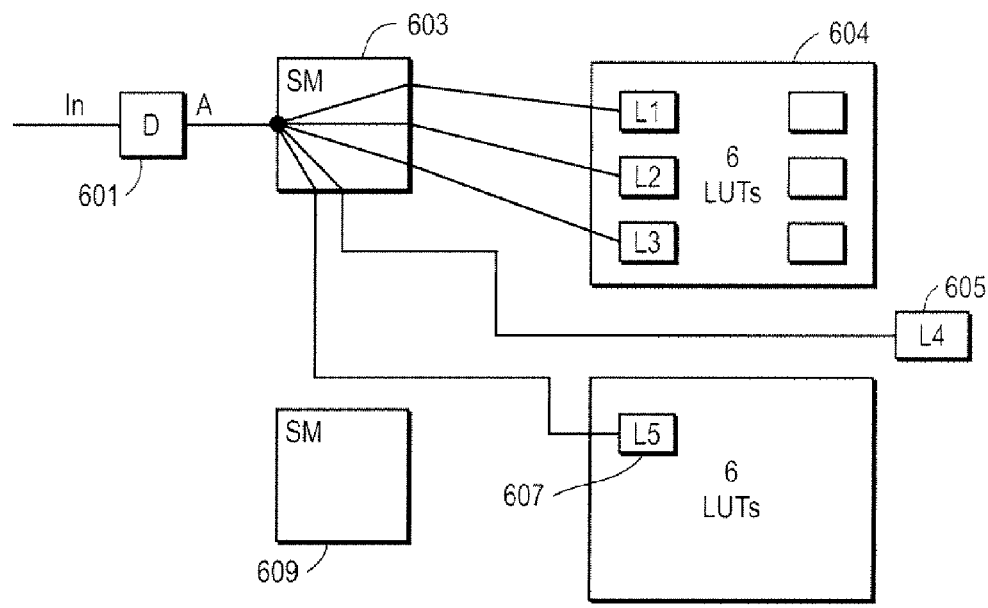
FIGS. 11A, 11B and 11C illustrate the process of designing a particular integrated circuit in a sequence in time.
Figure 11B:
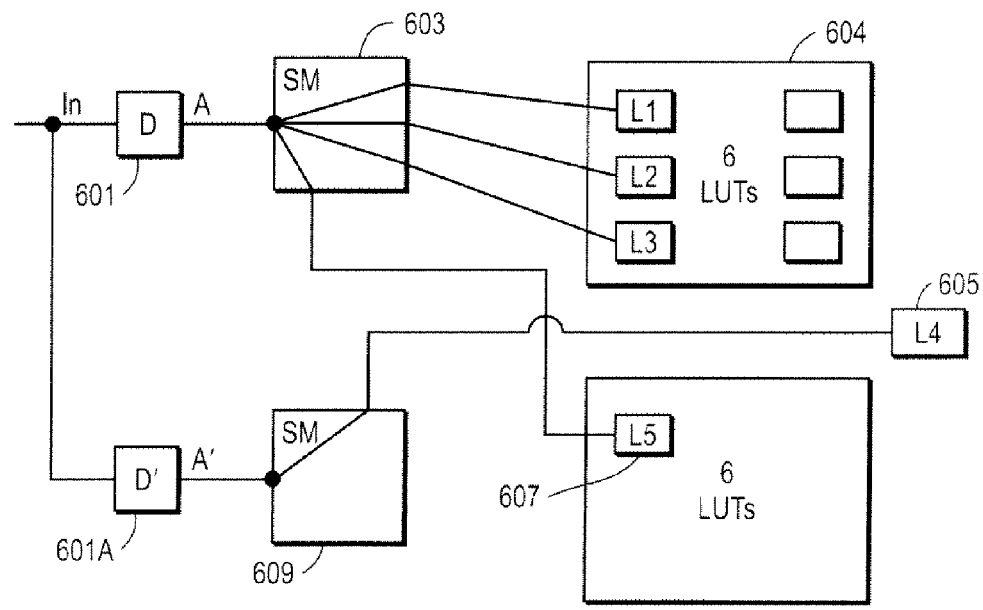
Figure 11C:
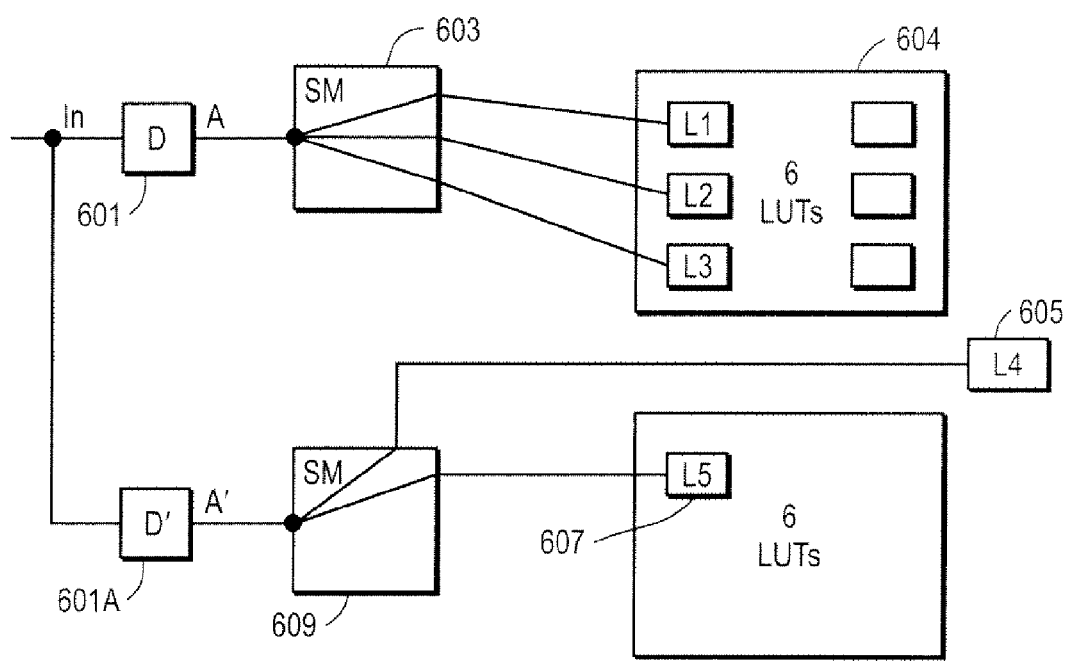
Figure 12:
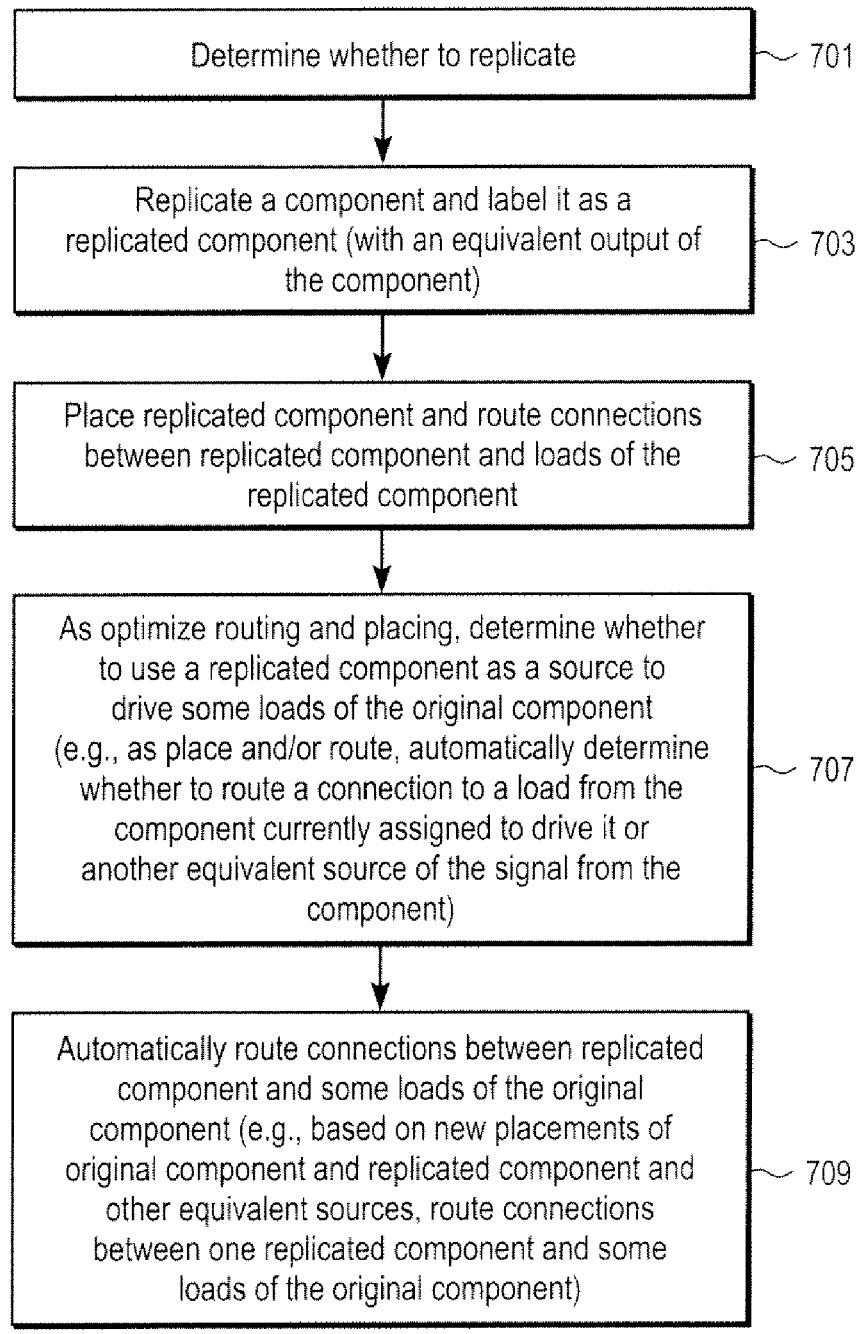
FIG. 12 is a flowchart which illustrates an exemplary method according to certain embodiments described herein, which method may produce the changes shown in FIGS. 11A, 11B and 11C.

FIGS. 11A, 11B, and 11C, and FIG. 12, relate to a method for routing from equivalent resources. Using this method, when a net needs to be routed, the system can dynamically route from any equivalent source of this net, such as a replicated instance of a driver which is the driver of all nodes for a particular net. The method shown in FIG. 12 will be used relative to the circuits shown in FIGS. 11A, 11B and 11C to describe one particular method for routing from equivalent sources. This method may be performed on optimization or whenever performing replication. Furthermore, this method may be used whenever placing objects, such as replicated objects, or when moving those objects around when attempting to optimize the design of an integrated circuit. In operation 701, it is decided whether or not to replicate a particular component. In the case of the circuit shown in FIG. 11A, the decision is made whether or not to replicate the driver 601 which currently drives, as shown in FIG. 11A, 3 loads L1, L2 and L3 in the array of 6 lookup tables 604 and load L5 in another part of the integrated circuit as well as a critical load L4 605. Because critical load L4 requires an improvement in slack, it is decided to replicate the driver 601, which has its output signal A driven to the 5 loads as shown in FIG. 11A. The replication operation is performed, resulting in the circuit shown in FIG. 11B in which the driver 601 is now replicated to create a replicated driver 601A which produces, at its output, A' which is equivalent to or the same as the output from the driver 601. This new replicated driver is coupled through a switch matrix 609 to the load 605. The driver 601 continues to drive the loads L1, L2 and L3 through the switch matrix 603 and also continues to drive the load L5. The design shown in FIG. 11B is an improvement over the design shown in FIG. 11A at least because of the fact that root fanout at the entrance to the switch matrix 603 has been reduced for the driver 601 and the load 605 now has its own dedicated driver which is a replicated copy of the driver 601. As shown in operation 703, when the component is replicated, it is labeled as a replicated component showing that it has an equivalent output of the equivalent component which was replicated. This tag permits the system to identify replicated components as being equivalent to the original component when routing and moving components around in the process of optimizing the design of an integrated circuit. The design shown in FIG. 11B is the result of operation 705 in which the replicated component has been placed in the design and the connections have been routed between the replicated component, in this case the driver 601A, and the load 605. In the process of continuing to optimize the routing and/or placement of components, it is determined whether, in operation 707, to use a replicated component as a source to drive some loads of the original component. For example, as the system places and routes during an optimization process, it can automatically determine whether to route a connection to a load from the component currently assigned to drive it or from another equivalent source of the signal from the component. The result of this operation and operation 709 is shown in FIG. 11C in which the load L5 is also coupled to the replicated driver 601A because it is an equivalent source to the driver 601. This produces a result in which the root fanout of the driver 601A is reduced to 3 and a potentially shorter routing resource is made available to drive the load L5 without potentially significantly impacting the driving of the load 605. The method of FIG. 12 may be performed when placing or moving components and gives a "placer" greater flexibility in placing objects around the design of the integrated circuit as equivalent sources for driving those loads can now be utilized.

Adjustment for Routing Geometry

Figure 13:
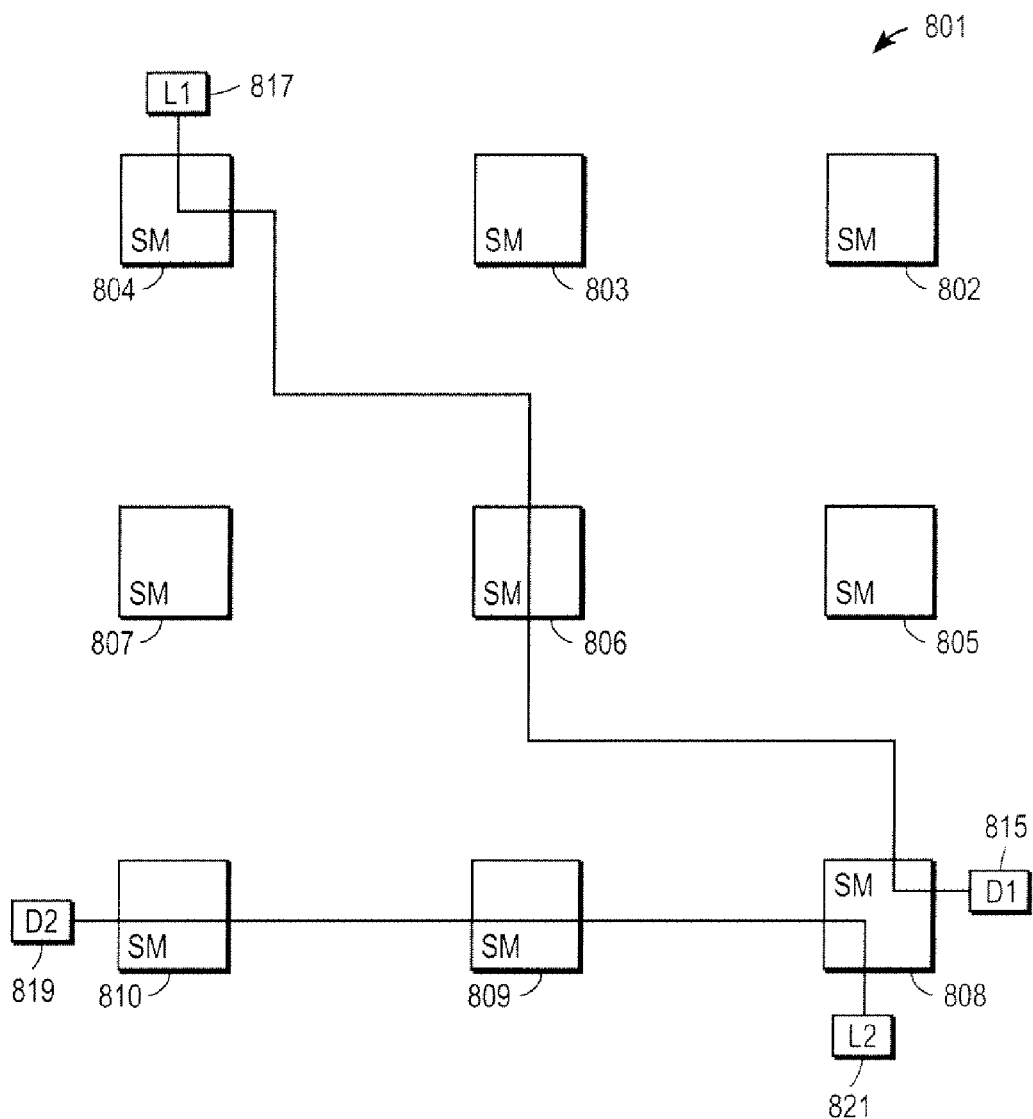
FIG. 13 shows an example of a layout of an integrated circuit having a plurality of switch matrices.
Figure 14:
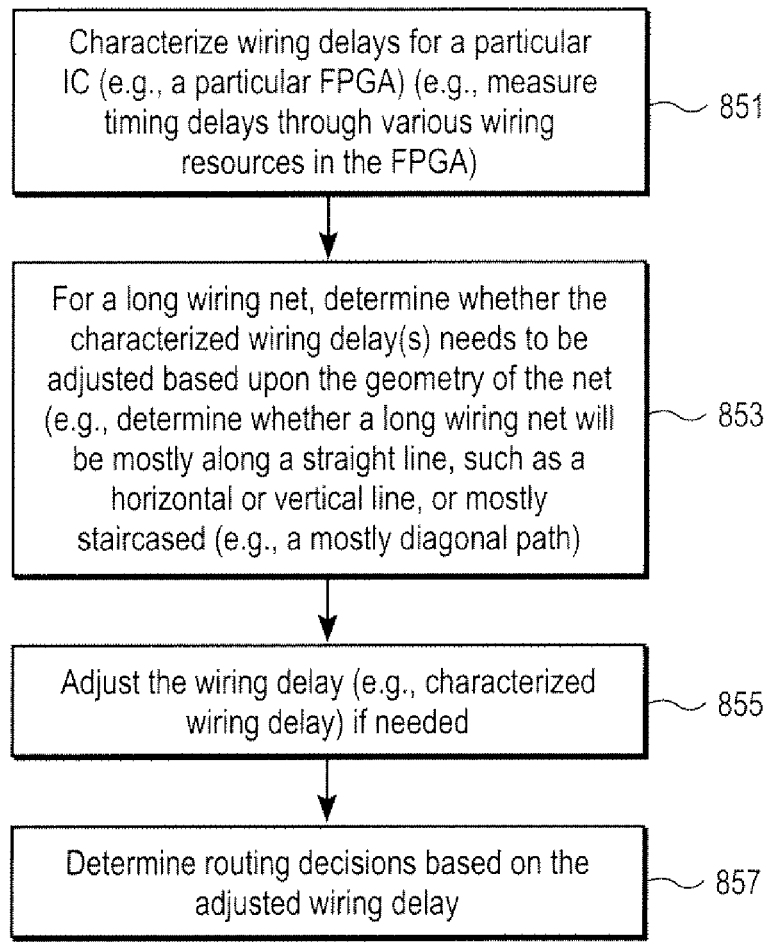
FIG. 14 is a flowchart which illustrates an exemplary method according to certain embodiments of the present invention which adjust wiring delay based upon the geometry of a routing net, such as the two different geometries shown in FIG. 13.

FIGS. 13 and 14 relate to an aspect of the present inventions in which characterized wiring delays are adjusted based upon the geometry of the wiring net. In at least certain chip architectures, it has been observed that the wiring delay through a substantially horizontal or substantially vertical wiring path may be slightly longer than anticipated relative to a wiring path which is substantially diagonal or staircased. The difference between these two geometries in routing nets is shown in FIG. 13. The routing net between driver D2 (driver 819) and load L2 (load 821) is a substantially horizontal routing path. On the other hand, the routing path between driver D1 and load L1 (driver 815 and load 817) is along a substantially diagonal path on the integrated circuit 801. This integrated circuit includes 9 switch matrices 802-810 which serve to allow loads and drivers to be interconnected across the integrated circuit. The wiring delay between switch matrices in either a horizontal or diagonal direction or a vertical direction may be characterized as shown in operation 851. This characterization may be an actual measurement of timing delays between adjacent or several switch matrices along a row or along a diagonal path or substantially diagonal path. The characterization may also be performed using predictions or estimates rather than actual measurements. In operation 853 it is determined, for a long wiring net, whether the characterized wiring delay needs to be adjusted based upon the geometry of the net. For example, it is determined whether a long wiring net will be mostly along a straight line, such as a horizontal or vertical line, or mostly along a staircased path, such as the path taken by the wiring net which couples the driver 815 to the load 817. If it is in fact determined in operation 853 that the wiring delay, which has been characterized, needs to be adjusted, then it is adjusted in operation 855 and then routing decisions are determined based upon the adjusted wiring delay in operation 857.

The adjustment of the timing delay can be performed dynamically as objects are moved or placed around the different switch matrices. The determination of whether the characterized wiring delay needs to be adjusted may be performed by calculating a probability that a particular net will not be wired along a horizontal line but by segments of horizontal and vertical lines going toward the load. This jog probability can be computed by statistically taking into account the wires that are already used on a particular portion of the path, and this probability can be calculated before completing the routing operation between the load and the driver. It can be taken into account for a design (or statistically computed for a collection of designs) the distribution of the number of drivers that have loads on a horizontal or vertical line. The routing architecture has a limited number of horizontal and vertical routing resources, so not all loads can be routed using a direct wire. Instead, the wiring for some loads will take a detour from the horizontal or vertical line. The probability of that detour is computed based on the number of horizontal or vertical wires and the distribution of the number of loads for drivers in a design (example 20 cells have 7 loads, 30 cells have 10 loads, etc.). Consequently, additional wiring delay is added to all long wires based on this jog probability.

Data Processing System

Figure 15:
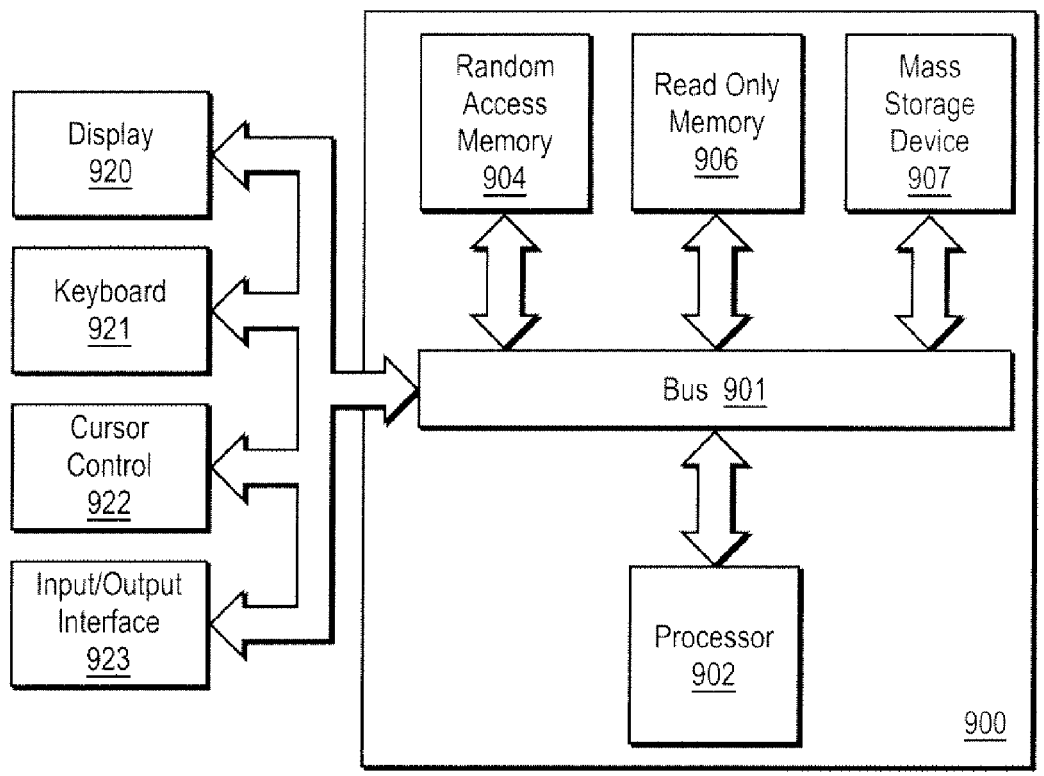
FIG. 15 is a block diagram of a data processing system, such as a computer system, that may be used to implement one or more of the embodiments described herein and may include one or more forms of machine-readable media which store executable program instructions which cause the data processing system to perform one or more of the methods described herein.

FIG. 15 shows a block diagram of a computer system which may be used to implement an embodiment of the present invention. The computer system may include one or more machine-readable media which store executable computer program instructions which when executed by the data processing system, such as the computer system, causes the computer system to perform one or more of the methods described herein. The computer system may, for example, be used to perform the progressive routing method described herein as part of a synthesis of an integrated circuit. The computer system includes a processor 902 which is coupled through a bus 901 to a random access memory 904, a read-only memory (ROM) 906 and a mass storage device 907. The mass storage device 907 represents a persistent data storage device, such as a floppy disk drive, a fixed disk drive or other non-volatile storage mechanisms, such as flash memory. The processor 902 may be embodied in a general purpose processor, such as an Intel Pentium processor or a special purpose processor or a specially programmed logic device. Display device 920 is coupled to processor 902 through bus 901 and provides graphical output for the computer system 900. Keyboard 921 and cursor control unit 922 are coupled to the bus 901 for communicating information and command selections to the processor 902. Also coupled to the processor 902 through bus 901 is an input/output interface 123 which can be used to control and transfer data to electronic devices, such as printers, other computers, etc. which are connected to the computer system 900. It should be noted that the architecture of the computer system shown in FIG. 15 is provided only for purposes of illustration, and that a computer used in conjunction with the present inventions is not limited to this specific architecture.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A machine-implemented method comprising:
   determining fanout of a driving component in a representation of an integrated circuit (IC);
   determining, for the driving component, critical loads and non-critical loads in the representation of the IC driven by the driving component;
   determining use of existing wiring resources used to connect the loads to the driving component;
   computing a routing net tree for each net comprising a first set of the existing wiring resources connected to the critical loads and a second set of the existing wiring resources connected to the non-critical loads at the fanout of the driving component; and optimizing a design of the IC by reducing the fanout of the driving component by using the first set of the existing wiring resources to connect the critical loads to one of the driving component and a replica of the driving component, and the second set of the existing wiring resources to connect the non-critical loads using another one of the driving component and the replica of the driving component, wherein at least one of the determining and optimizing is performed using a processor.

2. A method as in claim 1, wherein the existing wiring resources are associated with a routing net tree connecting the driving component to a plurality of nodes.

3. A method as in claim 1, determining the loads comprises determining which loads are critical loads for the driving component.

4. A method as in claim 1, wherein the reducing the fanout of the driving component comprises creating a replicated driver to drive the loads that are critical loads.

5. A method as in claim 1, wherein the reducing the fanout of the driving component comprises creating a replicated driver to drive the loads other than critical loads.

6. A method as in claim 1, wherein the driving component comprises one of: a flip-flop, a lookup table, and another logic element that generates signals.

7. A method as in claim 1, wherein the fanout is a root fanout of the driving component.

8. A method as in claim 1, further comprising determining a slack of the optimized design.

9. A non-transitory machine-readable medium storing executable program instructions which when executed by a data processing system cause the data processing system to perform a method comprising:

determining fanout of a driving component in a representation of an integrated circuit (IC);

determining critical loads and non-critical loads in the representation of the IC driven by the driving component;

determining use of existing wiring resources used to connect the loads to the driving component;

computing a routing net tree for each net comprising a first set of the existing wiring resources connected to the critical loads and a second set of the existing wiring resources connected to the non-critical loads at the fanout of the driving component;

and optimizing a design of the IC by reducing the fanout of the driving component by using the first set of the existing wiring resources to connect the critical loads to one of the driving component and a replica of the driving component and the second set of the existing wiring resources to connect the non-critical loads using another one of the driving component and the replica of the driving component.

10. A medium as in claim 9, wherein the optimizing further comprises determining whether to reduce the fanout of the driving component and wherein reducing the fanout of the driving component includes automatically replicating the driving component in response to the determining.

11. A medium as in claim 9, wherein the existing wiring resources are associated with a routing net tree connecting the driving component to all nodes.

12. A medium as in claim 9, determining the loads comprises determining which loads are critical for the driving component.

13. A medium as in claim 9, wherein the reducing the fanout of the driving component comprises creating a replicated driver to drive the loads that are critical loads.

14. A medium as in claim 9, wherein the reducing the fanout of the driving component comprises creating a replicated driver to drive the loads other than critical loads.

15. A medium as in claim 9, wherein the driving component comprises a flip-flop, a lookup table, or other logic element that generates signals.

16. A medium as in claim 9, wherein the fanout is a root fanout of the driving component.

17. A medium as in claim 9, further comprising determining a slack of the optimized design.

18. A data processing system comprising:

means for determining fanout of a driving component in a representation of an integrated circuit (IC);

means for determining critical loads and non-critical loads, in the representation of the IC, driven by the driving component;

means for determining use of existing wiring resources used to connect the loads to the driving component;

means for computing a routing net tree for each net comprising a first set of the existing wiring resources connected to the critical loads and a second set of the existing wiring resources connected to the non-critical loads at the fanout of the driving component;

and means for optimizing a design of the IC by reducing the fanout of the driving component by using the first set of the existing wiring resources to connect the critical loads to one of the driving component and a replica of the driving component, and the second set of the existing wiring resources to connect the non-critical loads using another one of the driving component and the replica of the driving component, wherein at least one of the means for determining, and means for optimizing includes a processor.

19. A data processing system, comprising:

a memory; and a processor coupled to the memory, wherein the processor is configured to determine fanout of a driving component in a representation of an integrated circuit (IC), the processor configured to determine for the driving component, critical loads and non-critical loads in the representation of the IC, driven by the driving component, and the processor configured to determine use of existing wiring resources used to connect the loads to the driving component; the processor configured to compute a routing net tree for each net comprising a first set of the existing wiring resources connected to the critical loads and a second set of the existing wiring resources connected to the non-critical loads at the fanout of the driving component;

and the processor configured to optimize a design of the IC by reducing the fanout of the driving component by using the first set of the existing wiring resources to connect to the critical loads to one of the driving component and a replica of the driving component, and the second set of the existing wiring resources to connect the non-critical loads using another one of the driving component and the replica of the driving component.

20. A data processing system as in claim 19, wherein the reducing the fanout of the driving component comprises
    replicating the driving component.

21. A data processing system as in claim 19, wherein the existing wiring resources are associated with a routing net tree connecting the driving component to all nodes.

22. A data processing system as in claim 19, determining the loads comprises
    determining which loads are critical for the driving component.

23. A data processing system as in claim 19, wherein the fanout is a root fanout of the driving component.

* * * * *